United States Patent [19]
Shiraki et al.

[11] Patent Number: 5,926,234
[45] Date of Patent: *Jul. 20, 1999

[54] LIQUID CRYSTAL DISPLAY DEVICE

[75] Inventors: Ichiro Shiraki, Tenri; Yasushi Kubota, Sakurai; Hiroshi Yoneda, Ikoma, all of Japan

[73] Assignee: Sharp Kabushiki Kaisha, Osaka, Japan

[*] Notice: This patent is subject to a terminal disclaimer.

[21] Appl. No.: 08/877,567

[22] Filed: Jun. 17, 1997

Related U.S. Application Data

[62] Division of application No. 08/394,626, Feb. 27, 1995, Pat. No. 5,671,026.

[30] Foreign Application Priority Data

Mar. 2, 1994 [JP] Japan ........................... 6-32612

[51] Int. Cl.⁶ ............... G02F 1/1333; G02F 1/1345; H01L 23/62
[52] U.S. Cl. ............... 349/40; 349/138; 349/149; 349/42; 257/355; 257/356
[58] Field of Search ............... 349/40, 42, 138, 349/149; 257/355, 356, 360

[56] References Cited

U.S. PATENT DOCUMENTS

| | | | |
|---|---|---|---|
| 4,409,724 | 10/1983 | Tasch, Jr. et al. . | |
| 5,068,748 | 11/1991 | Ukai et al. . | |
| 5,089,862 | 2/1992 | Warner, Jr. et al. | 257/350 |
| 5,200,876 | 4/1993 | Takeda et al. | 361/91 |
| 5,233,448 | 8/1993 | Wu | 359/88 |
| 5,373,377 | 12/1994 | Ogawa et al. | 359/54 |
| 5,657,139 | 8/1997 | Hayashi | 257/356 |
| 5,671,026 | 9/1997 | Shiraki et al. | 349/40 |

FOREIGN PATENT DOCUMENTS

| | | | |
|---|---|---|---|
| 59-182567 | 10/1984 | Japan | 257/360 |
| 63-10558 | 1/1988 | Japan | 257/360 |
| 1-287624 | 11/1989 | Japan . | |
| 4-109664 | 4/1992 | Japan | 257/355 |
| 4-120522 | 4/1992 | Japan . | |
| 5-49966 | 7/1993 | Japan . | |

*Primary Examiner*—William L. Sikes
*Assistant Examiner*—Toan Ton

[57] ABSTRACT

Picture elements and driving circuits for driving respective picture elements are monolithically formed on an insulating substrate. A protective circuit is provided for allowing input-output terminals of a driving circuit to conduct when a potential difference of not less than a predetermined value is generated. The protective circuit includes an MOS transistor, and a turn-on voltage thereof is set according to a thickness of a gate insulating layer. The protective circuit is formed on the insulating substrate simultaneously when forming the driving circuits. In this arrangement, because the turn-on voltage is set according to the thickness of the gate insulating layer and the thickness can be easily adjusted, an accurate turn-on voltage can be achieved. Since the arrangement prevents an increase in manufacturing cost, the driving circuits, etc., can be surely protected against static electricity generated in the manufacturing process and the input surge in the normal operation.

11 Claims, 12 Drawing Sheets

LIQUID CRYSTAL DISPLAY DEVICE

This application is a divisional of copending application Ser. No. 08/394,626, filed on Feb. 27, 1995, now U.S. Pat. No. 5,671,026 the entire contents of which are hereby incorporated by reference.

FIELD OF THE INVENTION

The present invention relates to a liquid crystal display device including a protective circuit for protecting internal circuits against an unexpectedly applied high-voltage such as static electricity, etc.

BACKGROUND OF THE INVENTION

Conventionally, active matrix liquid crystal display devices have been known as one of typical thin panel displays. In such liquid crystal display devices, as a display electrode substrate, an insulating substrate is used whereon switching elements such as picture elements, thin film transistors (hereinafter referred to as TFT) made from amorphous silicon, etc., are arranged in a matrix form.

The display electrode substrate is also arranged such that wirings including data signal lines, scanning signal lines, etc., for driving the picture elements are also formed on the insulating substrate so as to be connected to the TFT. As the insulating substrate, those of transmissive type, such as a glass plate, may be used.

The liquid crystal display devices of this type offer high quality display images. Moreover, the insulating substrate as a display electrode substrate does not have a strict restriction with respect to its area. Moreover, because of its adaptability to both the reflective type and the transmissive type, the practical applications of such liquid crystal display devices are enabled in a variety of fields.

The arrangement of an active matrix liquid crystal display device will be explained below. As shown in FIG. 12, in the liquid crystal display device, a plurality of data signal lines 42 and a plurality of scanning signal lines 43 are formed on an insulating substrate 1 in directions orthogonal to each other.

The data signal lines 42 and the scanning signal lines 43 three dimensionally cross with an insulating layer in-between, and a picture element 44 is formed so as to be surrounded by adjacent two data signal lines 42 and adjacent two scanning signal lines 43.

As shown in FIG. 13, an MOS-type transistor 45 that serves as a switching element is connected to a picture element 44. A source electrode of the transistor 45 is connected to the data signal line 42, a gate electrode of the transistor 45 is connected to a scanning signal line 43, and a drain electrode of the transistor 45 is connected to one of the electrodes of the picture element 44. The other electrode of the picture element 44 is connected to a common electrode as an earth electrode (not shown).

According to the described liquid crystal display device, in order to supply a data signal and a scanning signal to the picture element 44 provided with the transistor 45 (switching element), it is required to connect a driving IC as an external device. The driving IC is provided for driving the data signal lines and the scanning signal lines. The described connections can be made through the following two systems:

One of the systems is called "film-carrier system" wherein a signal is externally supplied from the driving IC through a connection film whereon a plurality of copper film signal lines are formed on a polyimide resin thin film base by making it in tight contact with a terminal array of the data scanning lines and a terminal array of the scanning signal lines formed on one of the substrates which constitute the liquid crystal display device. The other system is called the COG (Chip On Glass) system wherein the driving IC is directly mounted on a terminal formed on the peripheral portion of one of the substrates of the liquid crystal display device.

In order to improve the mounting efficiency of the driving IC, recently, the driver monolithic technique has been proposed wherein the driving IC (driver) is monolithically formed on the substrate in the manufacturing process of the substrate of the liquid crystal display device. According to the driver monolithic technique, since the number of input terminals of the liquid crystal display device can be reduced, a reduction in cost for mounting the components on a display module can be expected.

In the case of adopting the TFT composed of an amorphous silicon to the driving IC, because a sufficient driving power cannot be ensured, the arrangement is not suited for practical applications.

In order to counteract the described problem, it has been proposed that the TFT made of polycrystal silicon thin film is used as the switching element. The polycrystal silicon is used as a semiconductive layer formed on the insulating substrate. Such switching element composed of the polycrystal silicon thin film enables an improved drive capacity by more than ten times compared with the TFT made from amorphous silicon.

As a typical example of such TFTs made from the polycrystal silicon thin film, a polycrystal silicon thin film having a positive stagger structure will be explained in reference to FIG. 14. First, on the insulating substrate 41, a semiconductor layer 47 made from a polycrystal silicon is formed. After forming a gate insulating layer 48 and a gate electrode 49, a source electrode 50 and a drain electrode 51 are formed.

In the next stage, the insulating layer 52, metal wirings 53a and 53b and an insulating layer 54 are formed. Then, after forming a picture element electrode 55 composed of a transparent electrode (ITO: Indium-Tin Oxide), a protective film 69 is formed on an entire surface. Lastly, a light shielding metal film 70 is formed so as to cover the TFT composed of a semiconductive layer 47, a gate insulating layer 48, a gate electrode 49, a source electrode 50 and a drain electrode 51 from thereabove, thereby forming an active matrix substrate 56.

As a note, the light shielding metal layer 70 may be formed on a counter substrate 58 (to be described later). Although the above explanations have been given through the case of manufacturing the switching element in the picture element, the transistor which constitutes the driving IC may be manufactured in the same manner.

The manufacturing process of the liquid crystal display device including the substrate 56 will be explained next. A liquid crystal alignment film 59 made of polyimide, etc., is applied both on the substrate 56 formed in the semiconductor manufacturing process and on a counter substrate 58 having formed thereon a counter electrode 57. Thereafter, by rubbing a liquid crystal alignment film 59 with cloth, grooves which determine the orientation of the liquid crystal to be injected into the liquid crystal alignment films 59 are formed. In the described manufacturing process of the liquid crystal, high voltage of static electricity is likely to generate in the rubbing process.

In the next stage, two substrates 56 and 58 are bonded to one another while controlling the gap between them using a spacer, and a liquid crystal 60 is injected into the gap. Lastly, on both outer faces of the substrates 56 and 58, polarizing plates 61 are bonded, thereby obtaining a liquid crystal display panel.

In the described manufacturing process, static electricity may generate in the process of injecting the liquid crystal 60 and in the rubbing process of forming an alignment groove on the liquid crystal alignment film 59. Since the static electricity may cause an electrostatic breakdown in the picture element 44 of the driver monolithic liquid crystal display device and in the transistors which constitute the data signal line drive circuit and the scanning signal line drive circuit, the problem is presented in that the properties of the transistor vary.

As shown in FIG. 15, in order to solve the above-mentioned problems, a common wiring (short-circuit ring) is formed along the outer circumference of the insulating substrate 41 on the substrate 56 (display electrode substrate), and each of the input-output pads 63a and 64a of the data signal line drive circuit 63 and the scanning signal line drive circuit 64 and respective ends of the signal lines 42 and 43 develop short circuit.

By the described short circuit, even if a difference in potential occurs between the input-output pads 63a and 64a and between signal lines 42 and 43 due to the static electricity generated during the manufacturing process, the difference in potential is quickly dispersed to the input-output pads 63a and 64a and signal lines 42 and 43 through the common wiring 62, thereby preventing the problems that differences in potential are applied to the transistors as the switching elements. Therefore, the problem of lowering the property of the transistors and the insulation breakdown caused by the static electricity generated in the manufacturing process can be reduced.

However, in the described arrangement, since the signal lines 42 and 43 and input-output pads 63a and 64a develop short by the common wiring 62, it is difficult to perform defect checks of picture elements, disconnection checks of signal lines 42 and 43, and other defect checks.

In the method for manufacturing the liquid crystal display device, it is required, in its last stage, to make the signal lines 42 and 43, and input-output pads 63a and 64a electrically separated in order to drive each picture element 44, and to disconnect the common wiring 62 in the disconnecting process such as dicing process, laser beam emitting process, etching process, etc.

The described disconnecting process may damage the resulting substrate 56, and in order to perform the disconnecting process without damaging the substrate 56, a long time is required. Furthermore, the described static electricity proof structure is effective only in the manufacturing process, thereby presenting the problem that the protecting function against the surge input during the operation cannot be achieved by the described method.

The non-driver monolithic liquid crystal display device is disclosed, for example, in Japanese Laid-Open Patent Publication No. 49966/1993 (Tokukohei 5-49966). As shown in FIG. 16, the liquid crystal display device is arranged such that a protective circuit 65 is formed between at least one of the data signal line 42 and the scanning signal line 43 in the image display section and the common wiring 62 so as to be connected thereto.

In the protective circuit 65, two MOS type transistors 66 are connected in series, and the drain electrode and the gate electrode of the transistors 66 are respectively short-circuited.

In the described liquid crystal display device, when a normal operation voltage is applied to the data signal lines 42 and the scanning signal lines 43, one of the two transistors 66 connected in series is set in its ON position, while the other one of two transistors 66 is set in its OFF position. Therefore, in order to maintain the state where the signal lines 42 and 43 do not conduct, the operation of each transistor 45 as a switching element and each picture element 44 will not be disturbed. Therefore, disconnection checks of the signal wires 42 and 43 and defect check of the picture element 44 are enabled.

When an abnormal condition occurs, and a high voltage above the operation voltage is applied to the data signal line 42 and the scanning signal line 43, in the normal operation voltage, the transistor 66 set in its OFF position of the normal operation voltage is set ON by the breakdown between the source electrode and the drain electrode. Since the signal lines 42 and 43 are short-circuited, only a small potential difference develops between the signal lines 42 and 43, thereby preventing the electrostatic breakdown of the switching element.

In the described arrangement, when a voltage above the operation voltage, such as a static electricity, generates on the signal lines 42, or on the signal lines 43, the signal lines 42 and 43 are respectively short circuited to the common wiring 62 through the protective circuit 65 composed of two transistors 66, thereby reducing possible lowering of properties of the switching elements and the insulation breakdown due to the static electricity. This high voltage proof structure is effective also against the surge input in the normal operation.

According to the described conventional arrangement, when a normal operation voltage is applied, the signal lines and the pads are almost insulated. Therefore, disconnection checks and other defect checks are permitted. On the other hand, when a high voltage such as static electricity is applied, because of the breakdown of the transistor used in the protective circuit, the signal lines and the pads conduct so as to prevent possible damages and lowering of properties of the transistor against the applied high voltage.

As described, in the above-mentioned conventional arrangement, since the breakdown of the transistor, which is difficult to control, is involved, the problem is presented in that it is difficult to accurately set a turn-on voltage of the protective circuit.

SUMMARY OF THE INVENTION

The first objective of the present invention is to provide a liquid crystal display device which permits disconnection checks, defect checks, property checks, etc., even in the manufacturing process, and which has a protecting function against static electricity, surge input, etc., from external devices for not only a transistor as a switching element of a picture element but also for a transistor of a driving circuit for driving each picture element, during the manufacturing process and its active state without requiring additional manufacturing processes.

The second objective of the present invention is to provide a liquid crystal display device which eliminates the problems caused by static electricity generated in a rubbing process in which high voltage such as the static electricity is likely to generate, without requiring additional manufacturing processes.

In order to achieve the first objective, the liquid crystal display device of the present invention includes a plurality of data signal lines, a plurality of scanning signal lines which cross the plurality of data signal lines, a picture element array wherein each picture element is formed so as to be surrounded by adjacent data signal lines and adjoining scanning signal lines, a first MOS transistor as a switching element for driving each picture element, a driving circuit for driving each picture element through each signal line and the first MOS transistor, a plurality of input-output terminals for inputting and outputting a signal in and from the driving circuit, and a protective circuit for allowing input-output terminals of the driving circuit to conduct when a potential difference of not less than a predetermined value is generated across the input-output terminals of the driving circuit.

In the described arrangement, the plurality of data signal lines, the plurality of scanning signal lines, the picture element array, the first MOS transistor, the driving circuit, the plurality of input-output terminals and the protective circuit are monolithically formed on an insulating substrate, and the protective circuit includes a second MOS transistor which conducts when a potential difference of not less than the predetermined value is applied thereto, the second MOS transistor being connected across the input-output terminals in such a manner that a gate insulating layer in contact with a gate electrode of the second MOS transistor is thicker than a gate insulating layer in contact with a gate electrode of the first MOS transistor.

In the described arrangement, the thickness of the gate insulating layer in contact with the gate electrode of the second MOS transistor of the protective circuit is thicker than the thickness of the gate insulating layer in contact with the gate electrode of the first MOS transistor.

The threshold value of the gate voltage of the second MOS transistor, at which a current starts flowing between the source electrode and the drain electrode, increases as the gate insulating layer becomes thicker. Therefore, in the described arrangement, the threshold value of the second MOS transistor is set larger than the threshold value of the gate voltage of the first MOS transistor, i.e., larger than the maximum input voltage of the first MOS transistor in its normal active state by a predetermined value.

According to the described arrangement, when a potential difference between input-output terminals becomes greater than the maximum input voltage across the first MOS transistor and the driving circuit in their normal active states, if the potential difference exceeds the threshold value of the second MOS transistor, the source electrode and the drain electrode of the second MOS transistor conduct so as to compensate the potential difference.

Therefore, when the potential difference exceeds the threshold value, the protective circuit composed of the second MOS transistor allow the input-output terminals to conduct so as to reduce the potential difference, thereby preventing the driving circuit connected to the input-output terminals and the first MOS transistor from being damaged or deteriorating against the large potential difference due to static electricity.

Moreover, according to the described arrangement, when the potential difference of below the maximum input voltage of the normal active states is generated across the input-output terminals, the protective circuit controls the input-output terminals so as not to conduct. Therefore, disconnection checks and defect checks of the input-output terminals, data signal lines and the scanning signal lines and property checks of the first MOS transistor as a switching element and each picture element can be easily performed.

In the arrangement where the driving circuit, picture elements, the first MOS transistor as a switching element of each picture element and signal lines are monolithically formed on the insulating substrate, i.e., the components which constitute the driving circuit, such as a semiconductive layer, an insulating layer, an electrically conductive layer, etc., are laminated on the insulating substrate, the protective circuit can be manufactured simultaneously when forming the first MOS transistors, the switching element, driving circuit, etc. Therefore, the protective circuit can be manufactured on the insulating substrate without increasing the number of manufacturing processes.

Moreover, when a potential difference of above a predetermined value is generated across the input-output terminals during the normal operation due to static electricity, surge input from the external devices, adverse effect on the protective circuit and the first MOS transistor can be suppressed. As a result, the first MOS transistor for the picture element and the driving circuit can be protected.

According to the above arrangement, when the potential difference between the input-output terminals is below a predetermined value like the normal operation, the protective circuit maintains the non-conductive state of the input-output terminals. Therefore, since the input-output terminals do not conduct during the manufacturing process and normal operation, the switching elements of the picture elements and the driving circuits can be easily checked through the input-output terminals.

According to the described arrangement, when a potential difference of not less than a predetermined value is generated across the input-output terminals due to static electricity and input surge, etc., during the manufacturing process or the normal operation, the protective circuit allows the input-output terminals to conduct. Therefore, a potential difference larger than than an externally applied static electricity, etc., is not generated across the input-output terminals.

When a potential difference of not less than a predetermined value is generated, the potential difference is quickly reduced, thereby protecting the switching element of the picture elements and the driving circuit against the potential difference.

In the described arrangement, the gate insulating layer in contact with the gate electrode of the second MOS transistor is thicker than the gate insulating layer in contact with the gate electrode of the first MOS transistor which serves as a switching element of each picture element. Furthermore, since the threshold value of the gate voltage of the second MOS transistor increases as the thickness of the gate insulating layer that can be easily controlled, increases, the threshold value of the second MOS transistor can be set larger than that of the first MOS transistor with accuracy.

In the conventional arrangement, since the turn-on voltage of the protective circuit is set based on the breakdown voltage of the transistor of the protective circuit, it is difficult to control the turn-on voltage.

However, in the arrangement of the present invention, as the turn-on voltage and the corresponding threshold value of the second MOS transistor can be easily controlled, the turn-on voltage of the second MOS transistor can be easily set to a predetermined value higher than the voltage in the normal operation easily and accurately, thereby protecting the driving circuits, etc., against the static electricity and surge input, etc., more accurately than the conventional model.

Furthermore, since the protective circuit is monolithically formed on the insulating substrate simultaneously when forming thereon the picture elements, the data signal lines, the scanning signal lines and the driving circuit, etc., the described protective circuit can be formed on the insulating substrate without requiring additional manufacturing processes.

According to the described arrangement, by forming the driving circuits also on the insulating substrate, the mounting efficiency of the driving circuit can be improved. Furthermore, while suppressing an increase in the manufacturing cost, the driving circuits can be more surely protected against the static electricity generated during the manufacturing process and the surge input during the normal operation compared with the conventional model.

In order to achieve the second objective, another liquid crystal display device of the present invention is arranged so as to include: a plurality of data signal lines; a plurality of scanning signal lines which cross the plurality of data signal lines; a picture element array wherein each picture element for displaying an image is formed so as to be surrounded by adjacent data signal lines and adjoining scanning signal lines; a first MOS transistor as a switching element for driving each picture element; a driving circuit for driving each picture element through each signal line and the first MOS transistor; a plurality of input-output terminals for inputting and outputting a signal in and from the driving circuit; a liquid crystal alignment film formed on each picture element; and a short-circuit member for short-circuiting a surface of the liquid crystal alignment film and input-output terminals.

According to the described arrangement, the liquid crystal alignment film is an insulator. Therefore, before and after the rubbing process for forming alignment grooves in the liquid crystal alignment film, exposed electrodes connected to the liquid crystal alignment film do not conduct through the -liquid crystal alignment film. Therefore, in this arrangement, defect checks of the picture elements and the driving circuits and the disconnection checks of the signal lines can be performed through the input-output terminals.

In the rubbing process, since all the input-output terminals are in their open positions, the surface of the rubbing cloth is charged to the negative polarity, while the surface of the liquid crystal alignment film is charged to the positive polarity.

The surfaces of the input-output terminals that are instantaneously in contact with the rubbing cloth in the rubbing process are charged to the negative polarity by the charge on the surface of the rubbing cloth. However, since these input-output terminals and the surface of the liquid crystal alignment film are shorted by the exposed electrodes, the respective charges are cancelled out, thereby preventing the occurrence of the potential difference.

On the other hand, in the rubbing process, the input-output terminals which are not in contact with the rubbing cloth have the same potential as the liquid crystal alignment layer by the current flowing through the surface of the insulating substrate and the liquid crystal alignment layer. Therefore, a potential difference does not occur between them.

According to the described arrangement, in the rubbing process in which the static electricity is likely to generate, by forming the exposed electrodes, the potential difference between input-output terminals can be reduced, thereby avoiding an adverse effect from the static electricity. Moreover, the exposed electrodes can be monolithically formed on the insulating substrate simultaneously when forming thereon the input-output terminals and picture elements.

The described arrangement enables driving circuits, etc., to be protected against high potential such as static electricity generated in the rubbing process without increasing manufacturing costs nor requiring additional manufacturing processes.

For a fuller understanding of the nature and advantages of the invention, reference should be made to the ensuring detailed description taken in conjunction with the accompanying drawings.

DESCRIPTIONS OF THE EMBODIMENTS

[EMBODIMENT 1]

The following descriptions will discuss one embodiment of the present invention with reference to FIG. 1 through FIG. 8.

Figure 1:
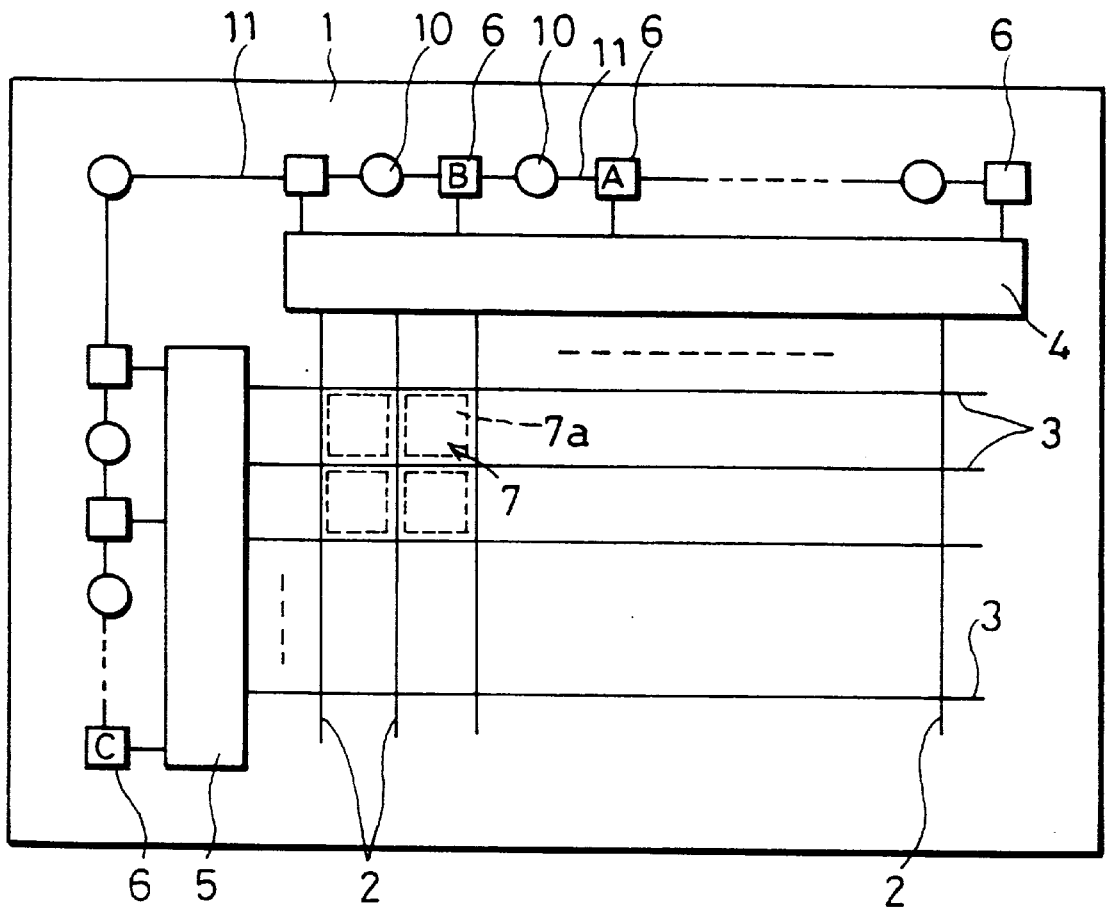
FIG. 1 is a view showing an arrangement of a liquid crystal display device in accordance with the first embodiment of the present invention.

As shown in FIG. 1, a liquid crystal display device in accordance with the present embodiment is a driver monolithic liquid crystal device of an active matrix type. The liquid crystal display device is provided with an insulating substrate 1 such as a glass substrate having a light transmitting property, etc. On the insulating substrate 1, data signal lines 2, scanning signal lines 3, a data signal line driving circuit 4 for driving each data signal line 2, a scanning signal line driving circuit 5 for driving each scanning signal line 3 and input-output pads 6 (input-output terminals) of driving circuits 4 and 5 are formed.

The data signal lines 2 and the scanning signal lines 3 are respectively formed in parallel with an equal interval between any adjacent data signal lines and adjacent scanning signal lines respectively. The data signal lines 2 are formed in a longitudinal direction, and the scanning signal lines 3 are formed in a lateral direction so that the signal lines 2 and 3 three dimensionally cross each other at an almost right angle.

Figure 2:
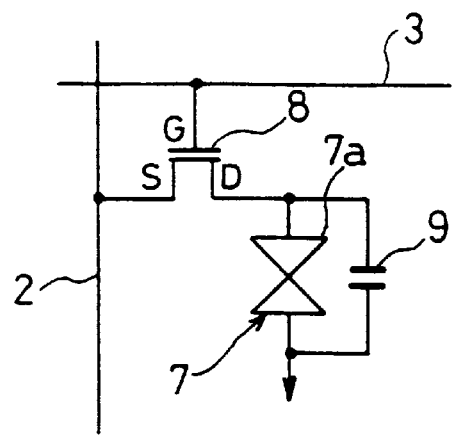
FIG. 2 is a view showing a schematic configuration of a picture element and a transistor as a switching element for the picture element of the liquid crystal display device of FIG. 1.

Furthermore, each picture element 7 is formed so as to be surrounded by adjacent two data signal lines 2 and adjacent two scanning signal lines 3. The picture elements 7 are arranged in a matrix form so as to form the picture element array. As shown in FIG. 2, to one of the picture element electrode 7a of the picture element 7, as shown in FIG. 2, as a switching element for controlling ON/OFF of the picture element 7, the MOS type transistor 8 (the first MOS transistor) is connected.

The source electrode of a transistor 8 is connected to the data signal line 2, and the gate electrode is connected to the scanning signal line 3. In order to adjust the response speed of the picture element 7, an auxiliary capacitor 9 may be formed between the picture element electrode 7a and the common electrode of the picture element 7, if necessary.

As shown in FIG. 1, between adjacent input-output pads 6 formed on the insulating substrate 1, a protective circuit 10 is formed so as to be connected across the pads 6 through connection lines 11.

Figure 3:
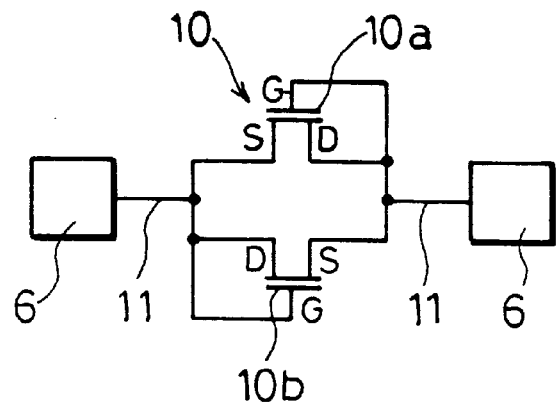
FIG. 3 is a view showing a schematic configuration of a protective circuit of the liquid crystal display device of FIG. 1.

As shown in FIG. 3, in the protective circuit 10, two thin-film transistors (hereinafter referred to as TFT) 10a and 10b connected in parallel are formed as the second MOS transistors. The respective source electrodes (S) of TFTs 10a and 10b are connected to the other gate electrode (G) and the drain electrode (D).

The source electrode (S) of the TFT 10a is connected to the gate electrode (G) and the drain electrode (D) of the TFT 10b and is also connected to one of the input-output pads 6 through the connection line 11. The source electrode (S) of the TFT 10b is connected to the gate electrode (G) and the drain electrode (D) of the TFT 10a, and is also connected to the other one of input-output pads 6.

The TFTs 10a and 10b respectively have individual threshold values at which the source electrode and the drain electrode conduct when a voltage of not less than a predetermined value is applied to the gate electrode. The respective threshold values of TFTs 10a and 10b are set to or above predetermined values that are higher than the maximum input voltages of the transistor 8 and the driving circuits 4 and 5 in their normal active states.

By connecting the TFTs 10a and 10b in parallel, under an applied potential difference between the input-output pads 6, irrespectively of whether the potential difference is positive or negative, at least one of the TFTs 10a and 10b conducts. Therefore, the potential difference can be reduced by the protective circuit 10.

The driver monolithic liquid display device in accordance with the present embodiment is arranged such that not only the signal lines 2 and 3, the picture element electrode 7a and each transistor 8 of the picture element 7, but also the driving circuits 4 and 5 and the protective circuit 10 are formed on the insulating substrate 1.

In the manufacturing method of the liquid crystal display device, the formation of the transistor 8 will be explained through the example of a positive stagger structure in which a semiconductive layer is made of a polycrystal silicon.

Figure 4:
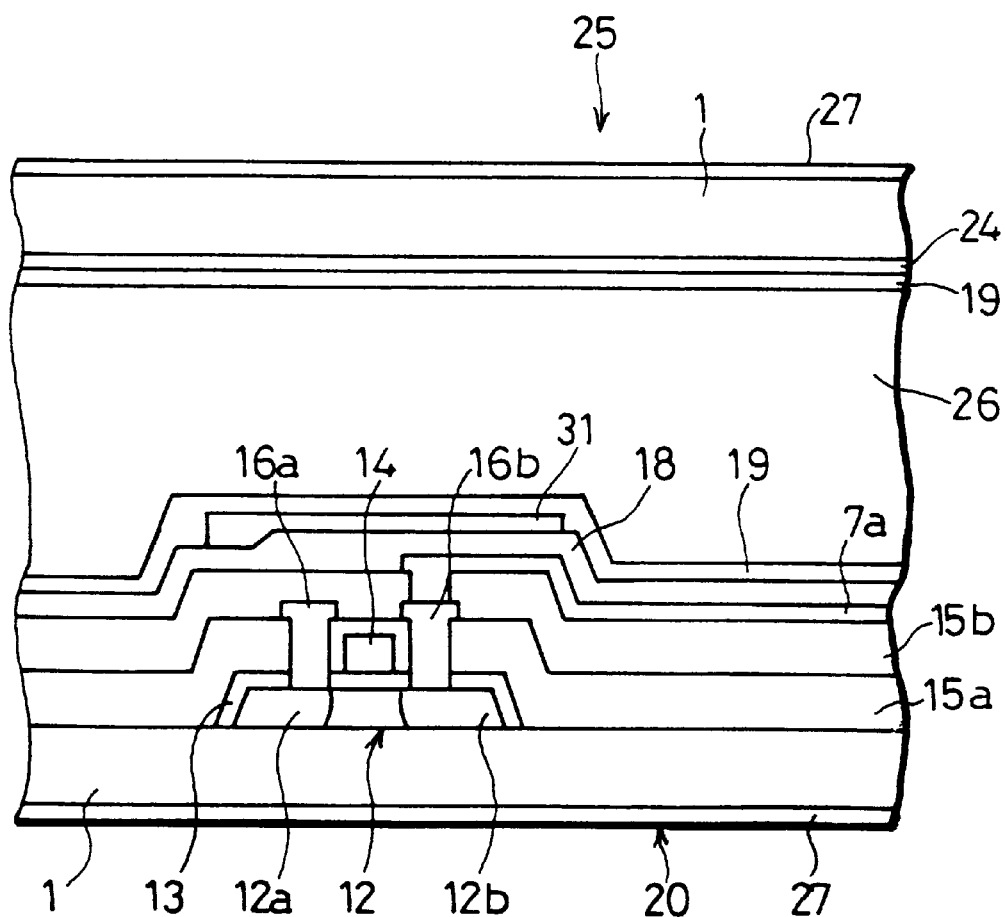
FIG. 4 is a view showing essential constitution of the liquid crystal display device.

First as shown in FIG. 4, a semiconductive layer 12 made of polycrystal silicon is formed on an insulating substrate 1. After forming a gate insulating layer 13 and a gate electrode 14, a source electrode 12a and a drain electrode 12b are formed on the semiconductive layer 12. Thereafter, the insulating layer 15a, metal wirings 16a and 16b and the insulating layer 15b are formed in this order on the insulating substrate 1.

Thereafter, the picture element electrode 7a composed of a transparent electrode (ITO) is formed so as to be connected to the drain electrode 12b through the metal wiring 16b. Then, the protective film 18 which covers the metal wirings 16a and 16b are formed on the insulating layer 15b and the picture element electrode 7a.

Thereafter, a light shielding metal layer 31 is formed so as to cover the transistor 8. Lastly, a liquid crystal alignment film 19 is formed on an entire surface of the substrate, thereby obtaining an active matrix substrate 20. The light shielding metal layer 31 is formed for preventing an adverse effect from light with respect to the transistor 8 by shielding light from the counter substrate 25.

The above explanations have been given through the case of manufacturing the switching element of the picture element 7. However, a functional component such as a transistor, etc., which constitutes the driving circuits 4 and 5 of the driving ICs can be manufactured in the same manner.

Next, more detailed configurations of TFTs 10a and 10b which constitute the protective circuit 10 shown in FIG. 3 will be explained below their manufacturing processes.

Figure 5:
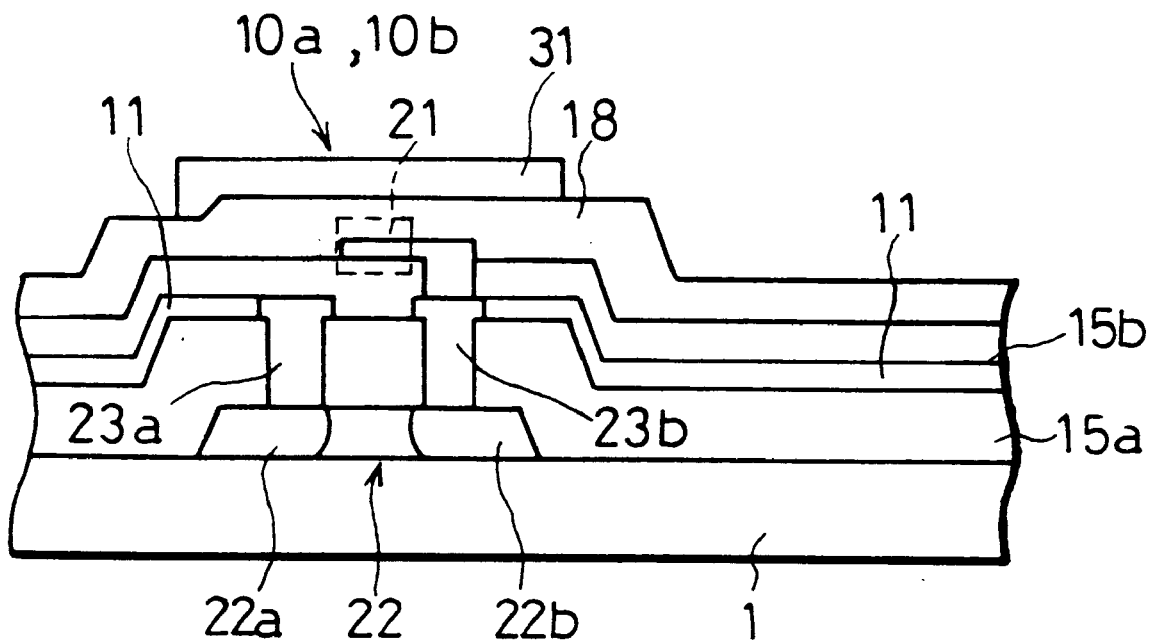
FIG. 5 is a view showing the constitution of the protective circuit of FIG. 3.

In the manufacturing processes of the TFTs 10a and 10b, when forming the data signal line 2, etc., (metal wiring layer for data signal line), the light shielding metal layer 31, a picture element electrode 7a (transparent electrode layer in the picture element 7), shown in FIG. 5, a gate electrode 21 of the TFTs 10a and 10b is formed at different position from the gate electrode 14 of the transistor 8, i.e., in an upper layer than the gate electrode 14.

More specifically, the gate electrode 21 of the TFTs 10a and 10b is formed in an upper layer than the gate electrode 14 of the transistor 8 on the insulating substrate 1, from the electrically conductive materials on the market used in monolithically forming the metal wiring layer, the light shielding metal layer, the transparent electrode layer, etc.

Next, the manufacturing method of TFTs 10a and 10b will be explained below in more detail. As shown in FIG. 4, the source electrode 22a and the drain electrode 22b are formed on the insulating substrate 1 on both sides of the semiconductive layer 22 when forming the semiconductive layer 12 of the transistor 8, i.e., after forming the semiconductive layer 22 composed of the polycrystal silicon, as in the aforementioned case of forming the transistor 8.

Thereafter, the insulating layer 15a, the metal wiring 23a and the metal wiring 23b are formed on the insulating substrate 1 in this order. Here, the metal wiring 23a is electrically connected to the source electrode 22a, and the metal wiring 23b is electrically connected to the drain electrode 22b.

In the meantime, each connection line 11 is formed so as to be electrically connected to one of the input-output pads (not shown) through the drain electrode 22b, and to the other input-output pad (not shown) through the source electrode 22a. Each connection line 11 being composed of a metal wiring layer for data signal line is provided for connecting these input-output pads to the TFTs 10a and 10b.

Next, the insulating layer 15b is formed, and the gate electrode 21 is formed on the insulating layer 15b so as to face the semiconductive layer 22.

By forming the gate electrode 21 in the described manner, the thickness of the gate insulating layer formed between the gate electrode 21 and the semiconductive layer 22 becomes a summation of the thickness of the insulating layer 15a and the insulating layer 15b. Therefore, the gate insulating layer can be made thicker than the gate insulating layer 13 of the transistor 8.

Here, the gate electrode 21 is formed so as to be electrically connected to the drain electrode 22b. Thereafter, the protective film 18 is formed so as to cover the gate electrode 21, and the light shielding metal layer 31 is formed on the protective film 18 so as to cover the TFTs 10a and 10b from above.

In the described arrangement, the driving circuits 4 and 5, signal lines 2 and 3 and the transistors 8 are monolithically formed on the insulating substrate 1. Therefore, the protective circuit 10 and the connection lines 11 can be formed simultaneously when forming the driving circuits 4 and 5 composed of the semiconductive layer, the insulating layer and the electrically conductive layer, or forming the picture elements 7, the transistors 8, etc.

As described, without requiring additional manufacturing processes, the gate insulating layer of the TFTs 10a and 10b can be made thicker than the transistor 8 of another transistor and the gate insulating layer of the transistor of the driving circuits 4 and 5, and TFTs 10a and 10b having higher threshold values than other transistors can be formed.

The thresholds values of TFTs 10a and 10b, that correspond to their turn-on voltages, increase as the thickness of the gate insulating layer increases. Moreover, the summation of the thicknesses of the insulating layers 15a and 15b, i.e., the thickness of the gate insulating layer can be easily adjusted.

Therefore, the turn-on voltages can be set easily and accurately. Namely, the turn-on voltages of the TFTs 10a and 10b can be accurately set to desirable voltages for the withstanding voltages of the elements such as the transistors 8, etc., i.e., to the voltages higher than the maximum input voltages of the driving circuits 4 and 5 in their normal operations by a predetermined voltage.

Additionally, it is preferable that the TFTs 10a and 10b which constitute the protective circuit 10 have equivalent electrical properties in their turn-on voltages and threshold voltages because in this way the TFTs 10a and 10b have equivalent protective functions against externally applied high voltage irrespectively of whether or not the voltage is positive or negative.

In the described arrangement, the explanations have been given through the case of forming the insulating layer 15b on the gate electrode 21. However, the gate electrode 21 may be formed in other positions as long as in an upper layer than the gate electrode 14 of the transistor 8. As the material for the gate electrode 21, the electrically conductive material used in the conventional process is preferable. However, other electrically conductive materials may be used as well.

In the present embodiment, semiconductive layers 12 and 22 made of polycrystal silicon films are used. However, it is not limited to the above, and those made of monocrystal silicon film may be used.

Next, the following manufacturing process of the liquid crystal display device will be explained. In FIG. 4, liquid crystal alignment films 19 made of polyimide, etc., are coated respectively on an active matrix substrate 20 manufactured in the semiconductive process and the counter substrate 25 whereon the counter electrode 24 is formed. A rubbing process is applied for rubbing the liquid crystal alignment films 19 in a predetermined direction with cloth so as to form grooves which determine the orientation of the liquid crystal.

In the next stage, the substrates 20 and 25 are laminated while controlling the gap between them using the spacer. Then, the liquid crystal 26 is injected into the gap. Lastly, polarization plates 27 are respectively laminated on the substrates 20 and 25 thus laminated, thereby manufacturing the liquid crystal display panel.

In such liquid crystal display panel, when a control signal for activating the picture element array composed of picture elements 7 is inputted to the input-output pads 6 from a drive unit (not shown), the control signal is converted through the driving circuits 4 and 5 and is transmitted to the picture element 7 through the signal lines 2 and 3 so as to display a predetermined image on the picture element array.

In the described liquid crystal panel, static electricity is generated during the rubbing process for the liquid crystal alignment film 19 and the injecting process of the liquid crystal 26. This may cause electrostatic breakdown in each picture element or in a transistor as a switching element which constitutes the data signal line driving circuit 4 and the scanning signal line driving circuit 5, or may vary the properties of the picture element.

Here, when a voltage higher than the maximum input voltage of the driving circuits 4 and 5 and the transistor in their normal operation by a predetermined value such as static electricity generated during the rubbing process of the manufacturing process or serve input in during the operation, etc., is applied between the exposed input-output terminals, a large potential difference may be generated across the input-output terminals.

However, according to the described arrangement of the liquid crystal display device in accordance with the present embodiment, since the protective circuit 10 allow the input-output pads 6 to conduct, a potential difference between the input-output pads 6 can be quickly eliminated.

In the arrangement of the embodiment 1, the transistor 8 as a switching element of the picture element 7 and respective transistors of the driving circuits 4 and 5 can be protected against an application of high voltage.

In the described arrangement of the present embodiment, the protective circuit 10 is surely set in its OFF position. Therefore, the input-output pads 6 are electrically disconnected, and using the input-output pads 6, the disconnection checks and defect checks of the transistors 8, the driving circuits 4 and 5 and the signal lines 2 and 3 can be performed without problems.

In the conventional model, a common wiring (short ring) for allowing the input-output pads 6 to conduct is provided for protecting the driving circuits against the static electricity. However, in the conventional arrangement, the normal operation is disturbed by the common wiring. Therefore, the disconnecting process for disconnecting the common wiring between the input-output pads by etching, dicing, etc., is required after the liquid crystal manufacturing process, thereby presenting the problem that the liquid crystal substrate may be damaged by the disconnecting process.

According to the arrangement of the present embodiment, since the conventional common wiring is not required, the problem associated with the conventional model that the active matrix substrate 20 is damaged due to the disconnecting process can be eliminated, thereby reducing the possibility of damaging the active matrix substrate 20.

In the case of employing the conventional protective circuit disclosed in Japanese Examined patent application 49966/1993 (Tokukohei 5-49966), when a large potential difference is applied across the input-output pads, the source and drain electrodes of the transistor of the protective circuit break down and conduct, thereby reducing a potential difference.

In the conventional model, since the turn-on voltage of the transistor is set based on the breakdown which is difficult to be controlled, the turn-on voltage becomes unstable. Therefore, the operation of the protective circuit using the transistor becomes unstable, and when a high potential difference is generated due to the static electricity, the protection of the transistors as the switching elements of the picture element in the protective circuit become unstable.

In order to counteract the above-mentioned problem, the present embodiment is arranged such that the turn-on voltage is set according to the thickness of the gate insulating layer that can be easily controlled, compared with the case of using the breakdown that is difficult to be controlled, the turn-on voltage of the protective circuit 10 can be set accurately. Therefore, the driving circuits 4 and 5, etc., can be protected by the protective circuit against the potential difference across the input-output pads 6 generated by static electricity, etc.

Figure 6:
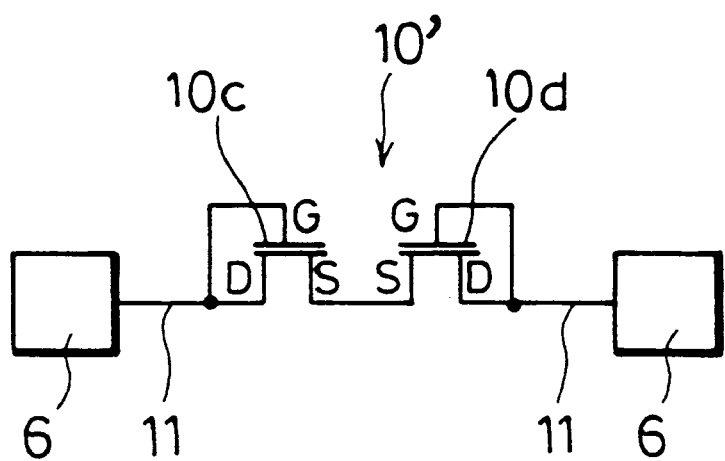
FIG. 6 is a view showing a schematic configuration of another protective circuit of the liquid crystal display device of FIG. 1.

The protective circuit 10 may be substituted for a protective circuit 10' composed of MOS TFTs 10c and 10d connected in series shown in FIG. 6. In the protective circuit 10', the respective electrodes (S) of the TFTs 10c and 10d are connected, and the respective gate electrodes (G) are connected to the drain electrode (D) of the same transistor. The respective breakdown values of the TFTs 10c and 10d are set to voltages higher than the maximum input voltage of the transistor 8 and the driving circuits 4 and 5 in their normal operations by a predetermined voltage.

If the desirable turn-on voltage cannot be obtained from one stage of the protective circuits 10 and 10', plural stages of protective circuits 10 and 10' shown in FIGS. 3 and 6 may be combined in series.

Figure 7:
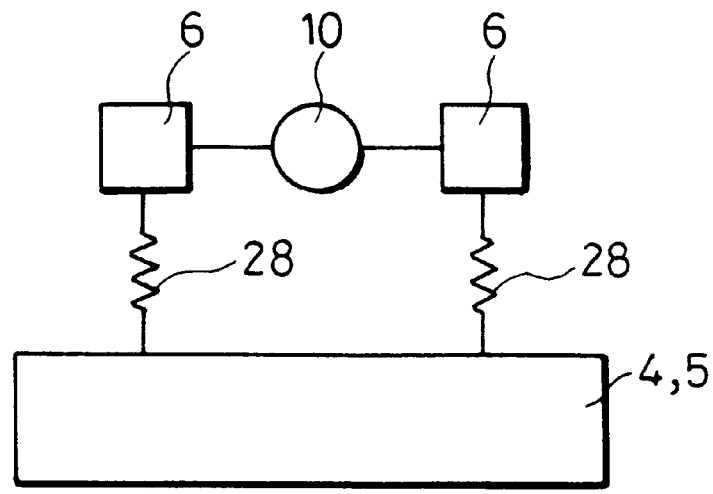
FIG. 7 is a view showing essential arrangement of one modified example of the liquid crystal display device.

Furthermore, in order to improve the effect of the protective circuit 10, resistances 28 may be formed between the driving circuits 4 and 5 and the respective input-output pads 6 as shown in FIG. 7. In this way, before a high voltage pulse generated by static electricity, etc., is input into the driving circuits 4 and 5 in the internal circuit, discharging may be easily achieved through the protective circuit 10.

In the arrangement of the present embodiment, the explanations have been given through the case of using the TFTs 10a and 10b as elements which constitute the protective circuit 10. However, the present invention is not limited to the described element. For example, non-linear element having the properties such as diode shown in FIG. 8, high resistance element, etc., may be used. Other elements than the TFTs 10a and 10b may be used in the following presented preferred embodiments.

Figure 8:
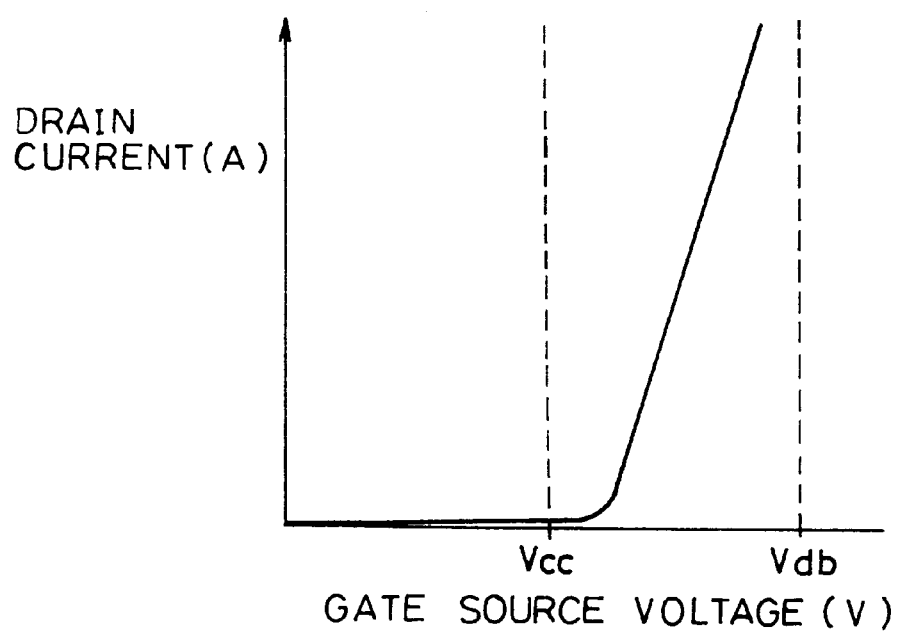
FIG. 8 is a graph showing properties of the transistor used in the protective circuit of FIG. 3.

In FIG. 8, Vcc is the power source voltage of the peripheral circuits such as driving circuits 4 and 5, and Vdb is a withstanding voltage of the peripheral circuit, and the turn-on voltage of the protective circuit 10 is set between the above voltages.

[EMBODIMENT 2]

Figure 9:
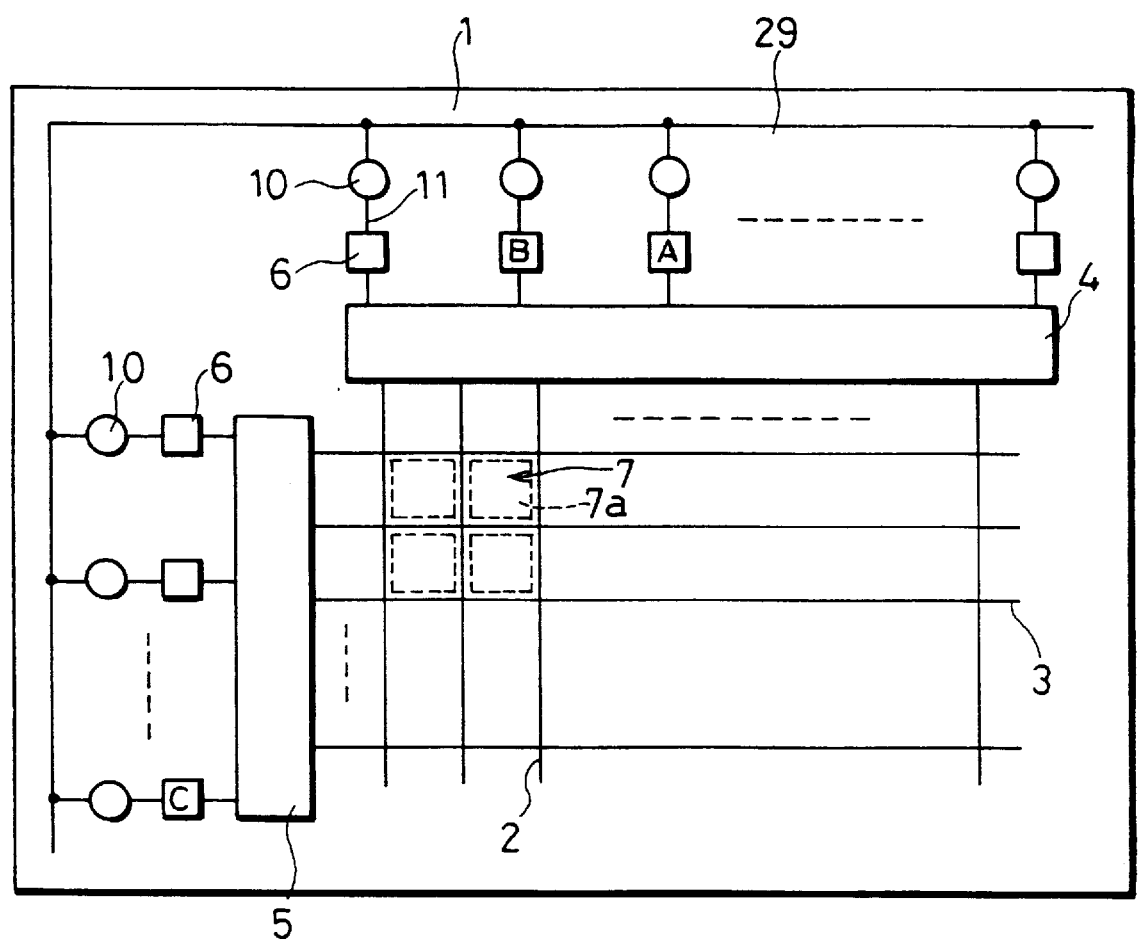
FIG. 9 is a view showing an arrangement of a liquid crystal display device in accordance with the second embodiment of the present invention.

The following descriptions will discuss another embodiment of the present invention with reference to FIG. 9. For convenience, members having the same functions as in the aforementioned embodiment will be designated by the same codes, and the descriptions thereof shall be omitted here.

As shown in FIG. 9, the liquid crystal display device of the present embodiment is arranged such that the common wiring 29 made of an electrically conductive material is formed on the insulating substrate 1 in a vicinity of the input and output pads 6, and a protective circuit 10 is formed between the input and output pads 6 and the common wiring 29.

In the second embodiment, when a voltage higher than the maximum voltage of the normal operation is applied between the input and output pad 6, the input and output pad 6 and the common wiring 29 conduct, and thus the potential difference between the input and output pads 6 is reduced.

Therefore, the transistors 8 (switching element) of the picture element 7 and the driving circuits 4 and 5 can be protected against static electricity generated during the manufacturing process and the surge input during the normal operation. Moreover, the driving circuits 4 and 5, transistor 8 and the signal lines 2 and 3 can be checked during the manufacturing process like the arrangement of the first embodiment.

Figure 10:
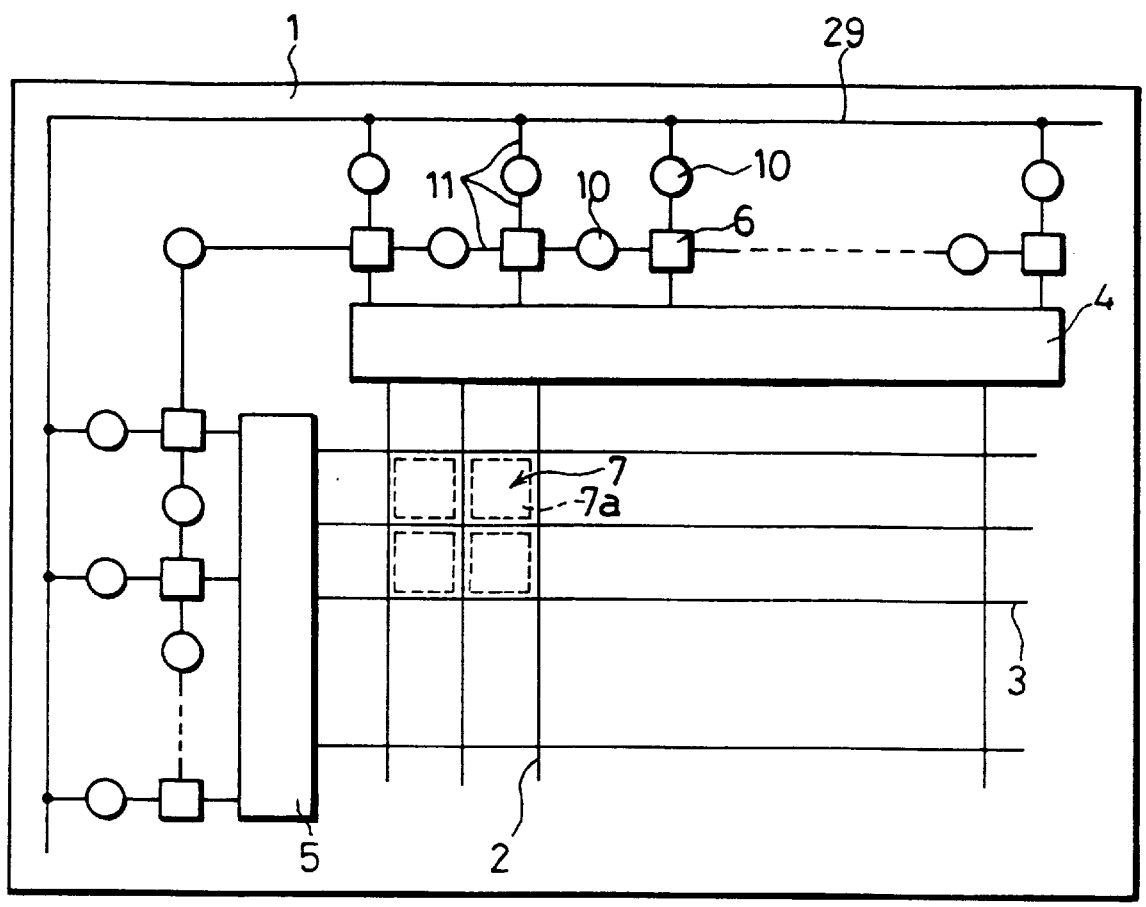
FIG. 10 is a view showing one modified example of the liquid crystal display device in accordance with the second embodiment.

The arrangement of the present embodiment may be modified such that the protective circuit 10 is provided between the adjacent input-output pads 6 on the insulating substrate 1 as shown in FIG. 10.

Here, it may be also arranged such that even if the potential difference occurs due to the static electricity between the input and output pads 6, the potential difference can be reduced quickly, and transistors 8 and the driving circuits 4 and 5 can be more surely protected.

The described effect can be achieved through the following mechanism. First, as shown in FIG. 1 and FIG. 9, when a high voltage pulse is applied between the adjacent input-output pads 6, for example, when a high voltage pulse is applied between A input-output pad 6 and B input-output pad 6 due to static electricity, etc., in the arrangement of the aforementioned embodiment, A input-output pad 6 and B input-output pad 6 conduct through one stage protective circuit 10, while in the arrangement of the present embodiment wherein the protective circuit 10 is formed only between the common wiring 29 and the input-output pad 6, A input-output pad 6 and B input-output pad 6 are electrically connected through the two protective circuits 10.

As described, the resistance between A input-output pad 6 and B input-output pad 6 is smaller in the first embodiment than that in the present embodiment. Therefore, the possibility of high voltage pulse entering through the driving circuits 4 and 5 (internal circuits) and the transistor 8 is lower in the arrangement of the first embodiment, and thus has a greater protection effect. As described in the first embodiment, by inserting a resistance between the driving circuits 4 and 5 and the respective input-output pads 6, a still greater effect can be achieved.

Next, the case where a high voltage pulse is applied due to the static electricity between A input-output pad 6 and C input-output pad 6 which are apart from one another will be explained in reference to FIG. 1 and FIG. 9. In the arrangement of the first embodiment, the protective circuits in a greater number than the number of the input-output pads 6 between A input-output pad 6 and C input-output pad 6 by 1 are formed, while in the arrangement where the protective circuit 10 is formed only between the common wiring 29 and the input-output pad 6, A input-output pad 6 and C input-output pad are electrically connected through two protective circuits 10.

Therefore, the resistance between A input-output pad 6 and C input-output pad 6 becomes smaller in present embodiment than that in the first embodiment. Therefore, in the arrangement where the protective circuit 10 is formed only between the common wiring 29 and the input-output pad 6, the possibility of high voltage pulse entering into the internal circuit of the driving circuits 4 and 5 and the transistors 8 is lowered. Thus, a greater protection effect than the arrangement of the first embodiment can be achieved.

As described, the arrangement of the first embodiment and the arrangement of the present embodiment where the protective circuit is formed only between the common wiring 29 and the input-output pad 6 offer the respective particular effects. By combining the advantageous features of these arrangements as shown in FIG. 10, a large potential difference generated between the input-output pads 6 can be reduced more quickly.

The following arrangement in the driver monolithic liquid crystal display device is disclosed in Japanese Laid-Open Patent Publication No. 120522/1993 (Tokukaihei 4-120522), at least two wirings of the input wiring array of the driving circuit for driving the image display section (picture element array) are shorted by the semiconductive layer so as to form an MIM (Metal Insulator Metal) element and to utilize the non-linearity property of the non-linear resistance of the MIM element.

Figure 17:
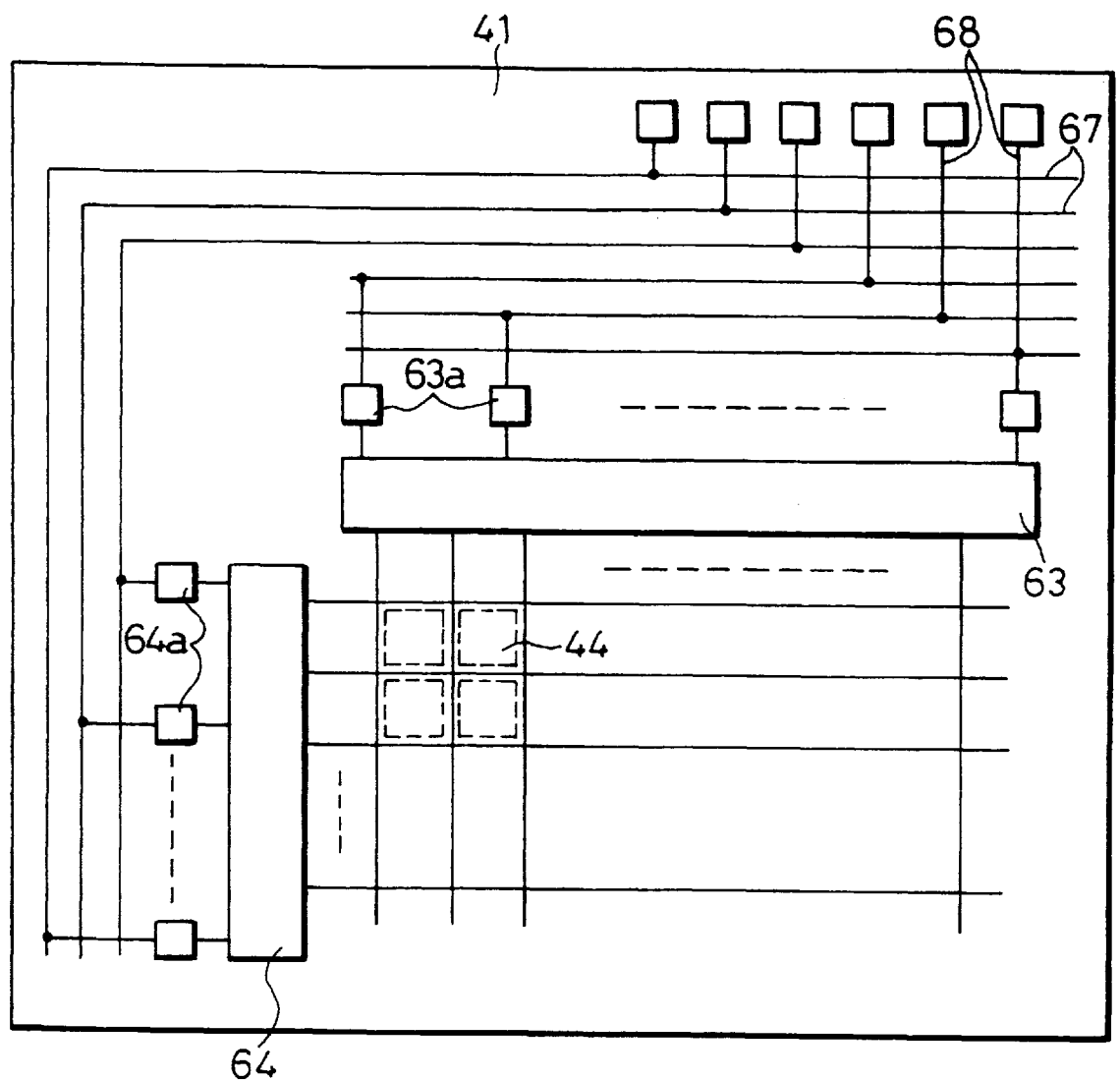
FIG. 17 is a view showing an arrangement of still another conventional liquid crystal display device.

As shown in FIG. 17, in the described arrangement, in the picture element portion where a plurality of picture elements 44 are formed, a plurality of input wirings 67 are formed in parallel on the insulating substrate 41 so as to surround the input-output pads 63a and 64a of the data signal line driving circuits 63 and the scanning signal line driving circuit 64. In the described arrangement, output wirings 68 respectively connected to the input wirings 67 are formed on the input wirings 67 so as to cross at right angle. Each input wiring 67 is connected respectively to the input-output pads 63a and 64a of the data signal line driving circuit 63 and the scanning signal line driving circuit 64.

The input wirings 67 and the output wirings 68 are formed in the following manner. First, the output wirings 68 are formed on the insulating substrate 41 and coat the insulating layer on the output wirings 68. Then, on the insulating layer, the semiconductive layer is formed along the output wiring 68 so as to cover the intersection between the output wiring 68 and the input wiring 67.

In the next stage, on the insulating layer and the semiconductive layer, the input wirings 67 are formed so as to cross the output wirings 68 at almost right angle and are electrically connected to the semiconductive layer in contact therewith.

By forming the input wirings 67 and the output wirings 68 in the described manner, the input wirings 67 respectively form a Schottky diode through the semiconductive layer.

Therefore, even if a large potential difference is generated between the two input wirings 67, current flows in such a direction of eliminating the potential difference between the input wirings 67. Therefore, deterioration of the properties of the switching element of the picture element 44 and the insulating breakdown by the static electricity, etc., can be reduced.

However, in the described arrangement, the additional manufacturing process for laminating the semiconductive layer is required, thereby presenting the problem of increasing the number of manufacturing processes and of increasing cost as a longer time is required for the manufacturing. Additionally, it is difficult to control the turn-on voltage of the MIM element using the semiconductive layer.

In the respective arrangements of the first and second embodiments, however, the protective circuit 10 can be formed simultaneously when forming the driving circuits 4 and 5, and thus additional manufacturing process is not required. Moreover, the turn-on voltage of the protective circuit 10 can be easily controlled and can be set with accuracy. The described protective circuit 10 offers a greater protection function for driving circuits 4 and 5 against static electricity generated during the manufacturing process and the input surge during the normal operation. In addition, the protective circuit 10' may be used in replace of the protective circuit 10.

[EMBODIMENT 3]

Figure 11:
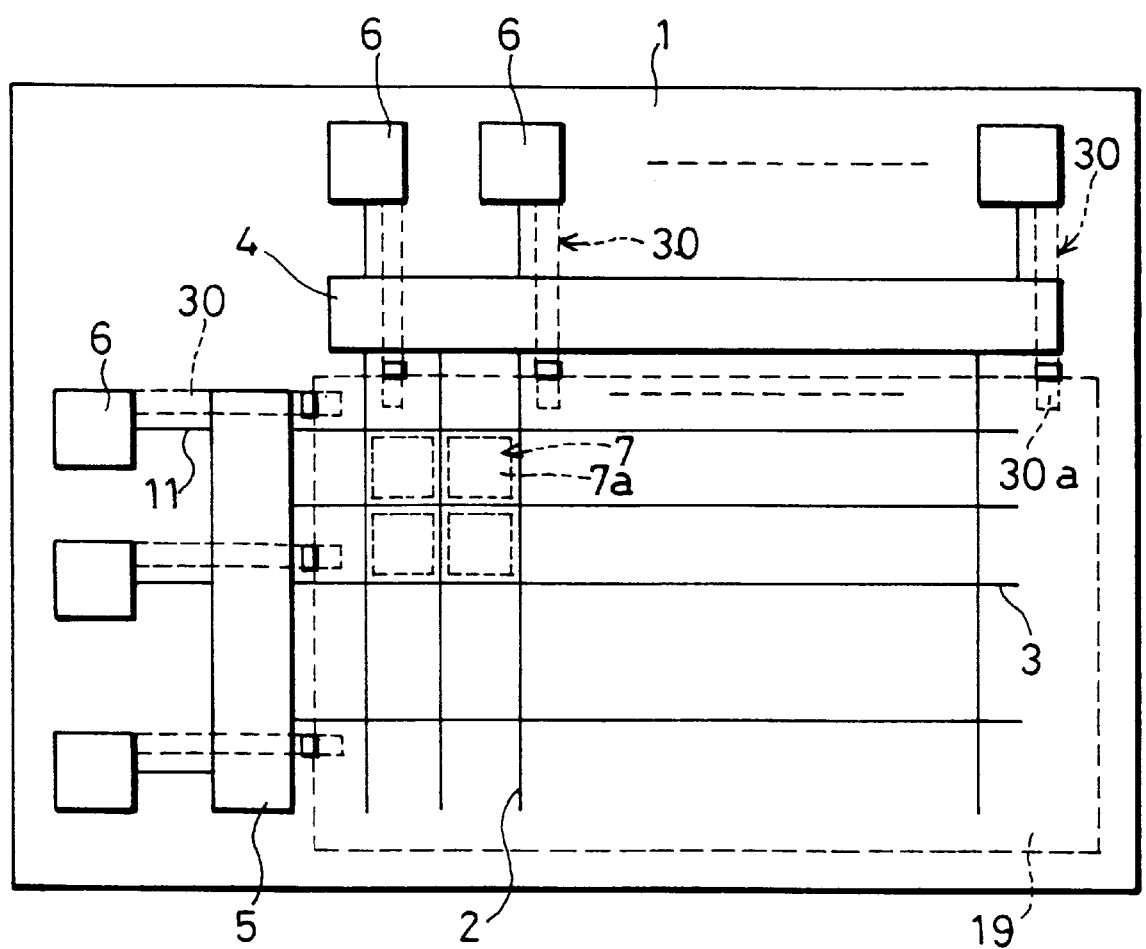
FIG. 11 is a view showing an arrangement of a liquid crystal display device in accordance with the third embodiment.
Figure 12:
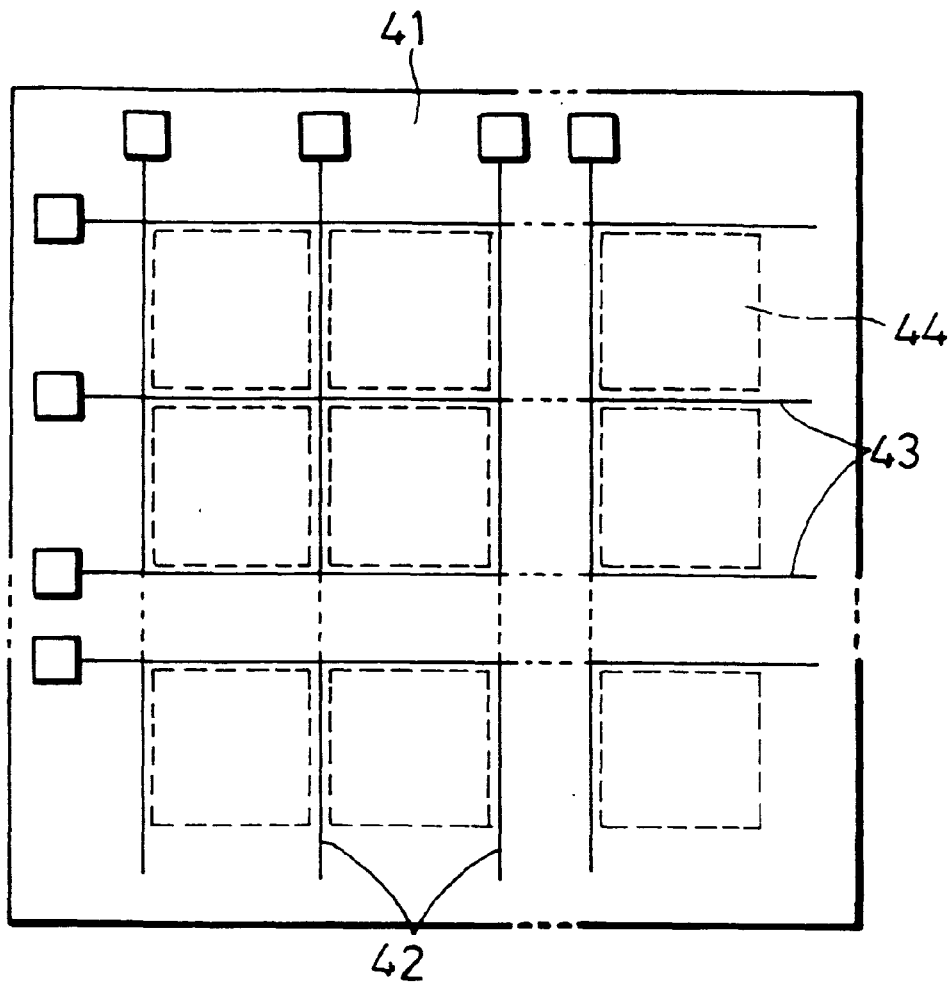
FIG. 12 is a view showing essential arrangement of a conventional liquid crystal display device.
Figure 13:
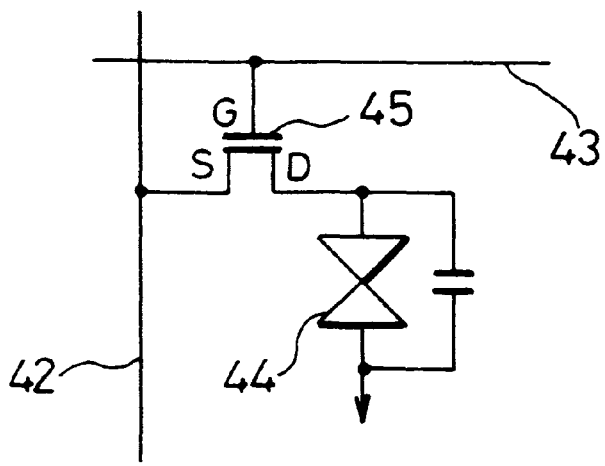
FIG. 13 is a view showing an arrangement of a picture element and a transistor which serves as a switching element for the picture element in the liquid crystal display device of FIG. 12.
Figure 14:
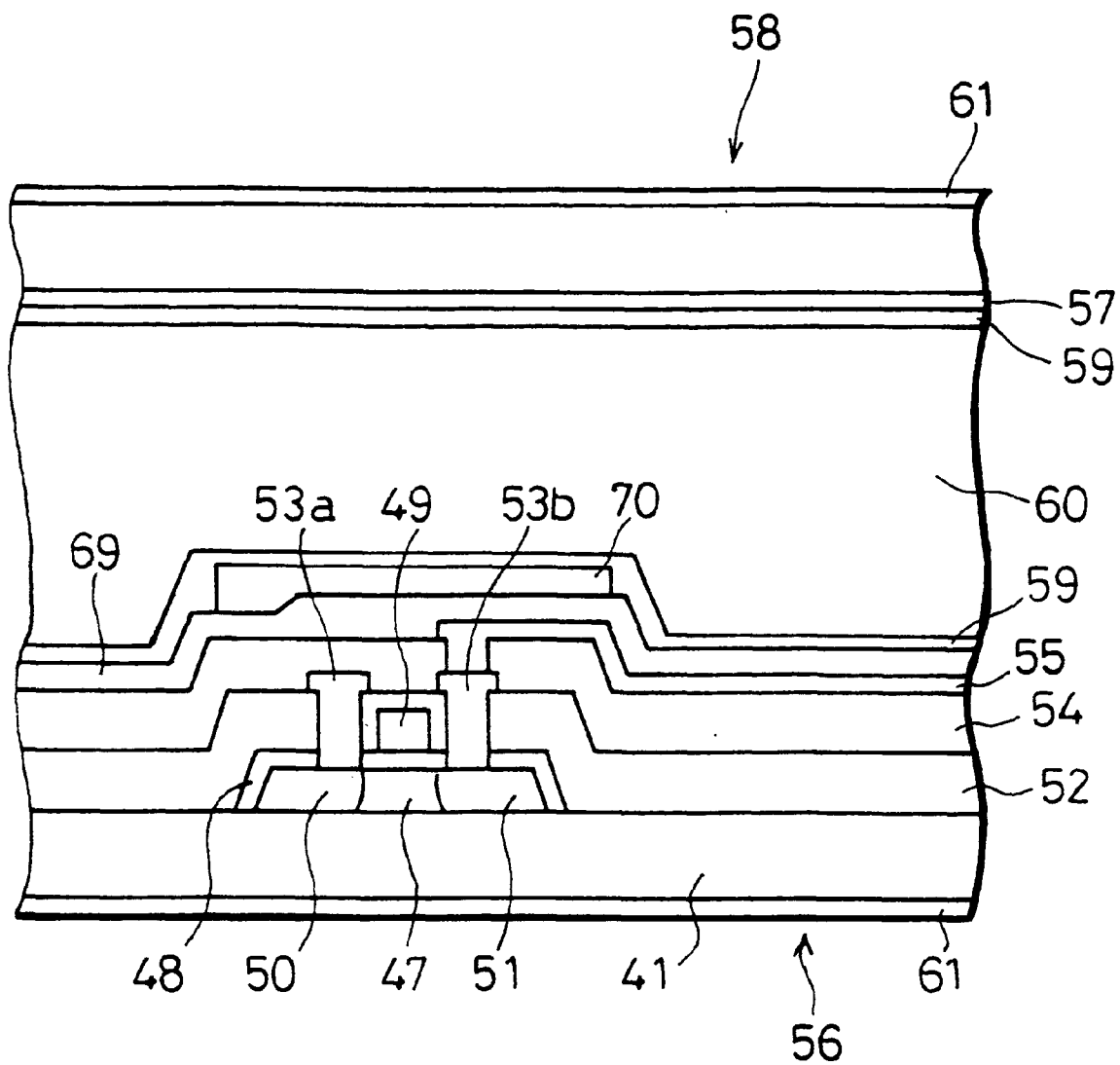
FIG. 14 is a view showing essential constitution of the liquid crystal display device of FIG. 12.
Figure 15:
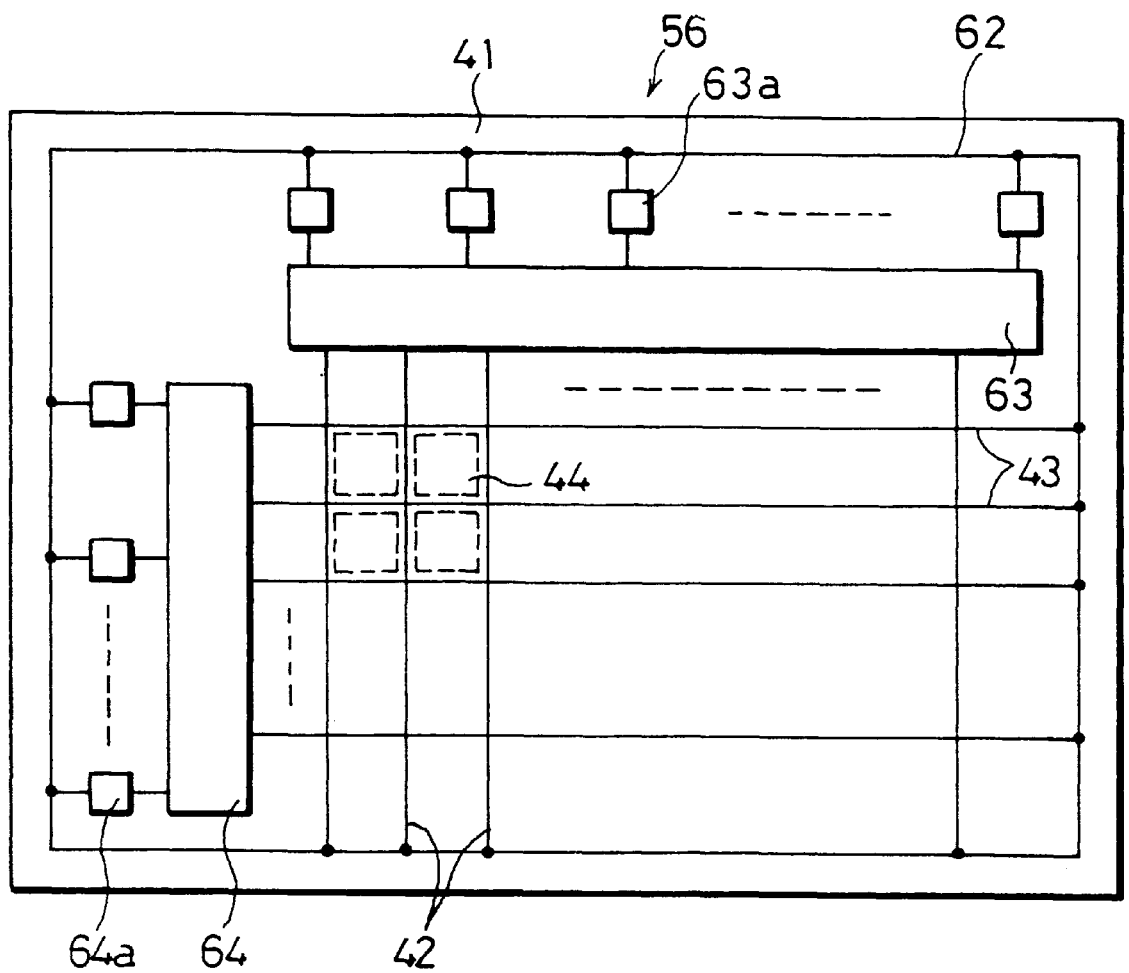
FIG. 15 is a view showing an arrangement of another conventional liquid crystal display device.
Figure 16:
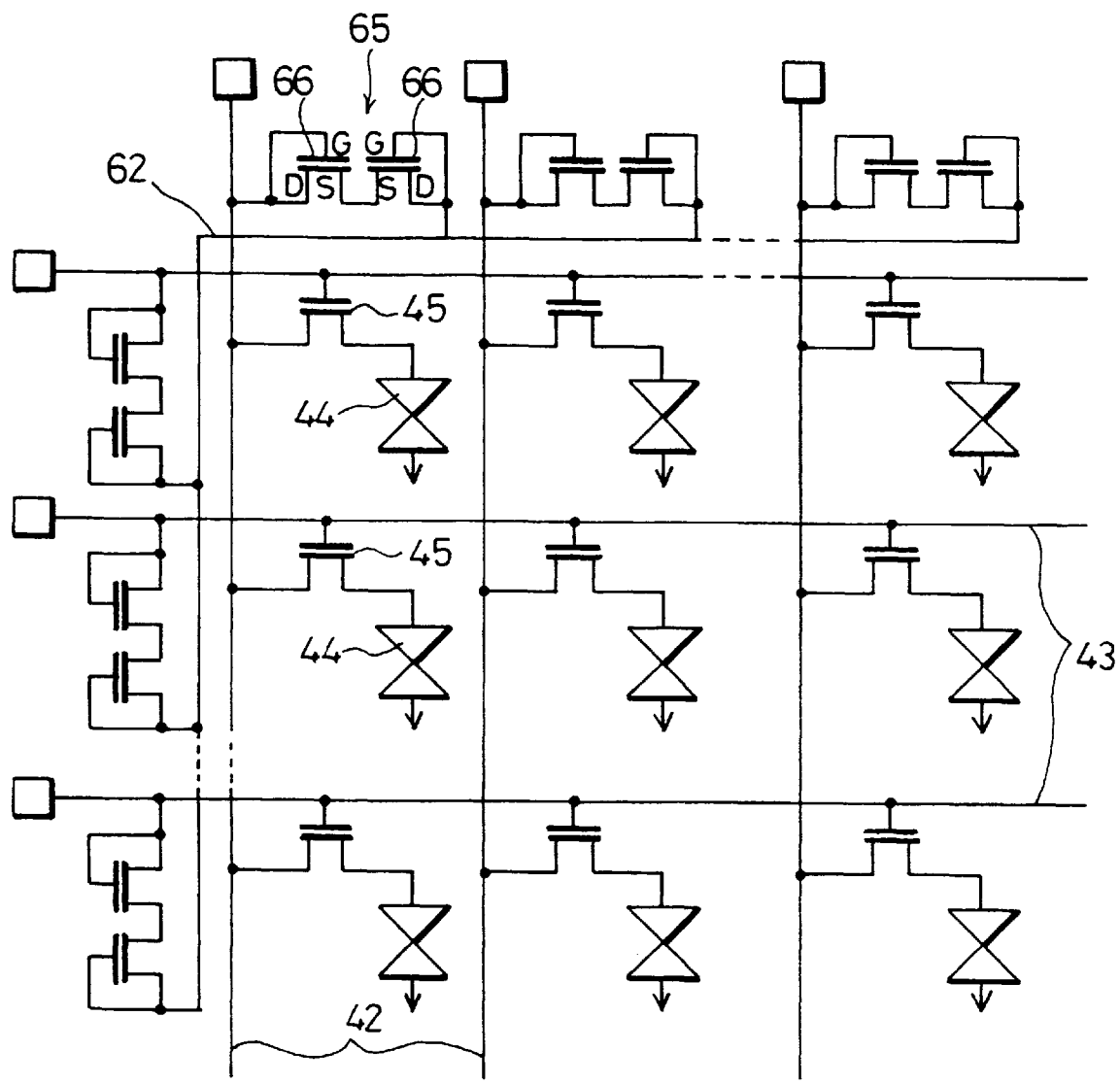
FIG. 16 is a view showing an arrangement of still another conventional liquid crystal display device.

The following descriptions will discuss still another embodiment of the present invention with reference to FIG. 11. For convenience, members having the same functions as in the aforementioned embodiments will be designated by the same codes, and the descriptions thereof shall be omitted here.

As shown in FIG. 11, the liquid crystal display of the present embodiment is a driver monolithic active matrix liquid crystal display, and is provided with exposed electrodes 30 (shorting member) which respectively allow the input-output pads 6 and the surface of the liquid crystal alignment films 19 to be shorted. One end portion 30a of each exposed electrode 30 is exposed to be connected to the surface of the peripheral portion of the liquid crystal alignment layer 19. The exposed electrodes 30 have an one-to-one correspondence with the input-output pads 6.

The exposed electrodes 30 can be formed simultaneously when forming the respective input-output pads 6 and the picture element electrodes 7a of the picture elements 7 without requiring additional manufacturing processes.

In the described arrangement of the present embodiment, in the processes before or after the rubbing process, the liquid crystal alignment film 19 is an insulator. Therefore, the exposed electrodes 30 in contact with the liquid crystal alignment film 19 can be prevented from conducting through the liquid crystal alignment film 19. Therefore, in this arrangement, the disconnection and defects of the picture elements 7, driving circuits 4 and 5 and the signal lines 2 and 3 can be checked without problems.

On the other hand, in the rubbing process for rubbing the grooves formed on the liquid crystal alignment film 19 with cloth, which determine the orientation of the injected liquid crystal (not shown), the input-output pads 6 are in their open position. Therefore, the surface of the rubbing cloth is charged in the negative polarity, while the liquid crystal alignment film 19 that is shorted to the input-output pad 6 is charged in the positive polarity.

The surface of the input-output pad 6 in contact with the rubbing cloth is instantaneously charged to the negative polarity by the charge on the surface of the cloth. However, the input-output pad 6 and the liquid crystal alignment film 19 are shorted by the exposed electrode 30. Therefore, the respective charges are cancelled one another, thereby preventing the problem that the potential difference does not occur between the input-output pads 6 and the liquid crystal alignment film 19.

On the other hand, the input-output pads 6 which are not in contact with the rubbing cloth have the same potential with the liquid crystal alignment film 19 through the exposed electrodes 30 by the current flowing through the surface of the active matrix substrate 20, thereby preventing the potential difference between them and between the input-output pads 6.

According to the described arrangement, in the rubbing process for forming the alignment grooves in the liquid crystal alignment film 19, the potential differences between the input-output pads 6 due to static electricity of high voltage which is like to generate in the rubbing process can be prevented. Therefore, the switching elements of the picture element 7 and the driving circuits 4 and 5 can be protected against the static electricity of high potential.

Additionally, the wirings between the exposed electrodes 30 and the input-output pads 6 are at random. Even if the wirings themselves are exposed, it would not cause any drawback. Wiring is not specified as long as the exposed electrically conductive portion and the liquid crystal alignment film 19 are electrically connected. The shape of the exposed electrode 30 is not limited to the described shape, and other shapes such as circular and rectangular may be used.

As disclosed in Japanese Examined Patent publication No. 28764/1988 (Tokukohei 1-287624), in the process in which static electricity is likely to generate, the adverse effect from the static electricity can be prevented by covering all the electrically conductive portions with an insulating layer.

In the described arrangement, the insulating substrate whereon the driving circuits including a scanning circuit, an image display section composed of picture elements and wirings are formed is coated with the first insulating layer except the input-output pads of the scanning circuit. Then, the insulating substrate is entirely coated with the second insulating layer which is more easily removed by etching than the first insulating layer. Thereafter, only the second insulating layer is selectively removed by etching.

According to the described arrangement, among the processes for manufacturing a liquid crystal, only in the process in which the static electricity is most like to generate, such as the rubbing process, the input-output pads and the driving circuit required for the detections to be performed when the image display section composed of picture elements and the wirings of the image display section are formed can be coated with the second insulating layer so as to electrically insulate them from the external section.

In this way, the drawback due to the static electricity generated in the liquid crystal manufacturing process can be avoided by the second insulating layer required during the manufacturing process. Moreover, before and after the described manufacturing process, as the input-output pads are exposed, the driving circuit, etc., can be checked using the input-output pads.

However, the described arrangement requires additional etching process for removing the second insulating layer. Moreover, the described etching process for removing the second insulating layer to be performed under an unfavorable condition is required in the liquid crystal manufacturing process, the insulating substrate or the driving circuits or wirings on the insulating substrate may be damaged, thereby presenting the problem that the quality of the display image of the image display device may be lowered.

However, in the arrangements of the described first through third embodiments, the etching process to be performed under an unfavorable condition is not required. This eliminates the problem that the resulting active matrix substrate 20 is damaged and enables a simplified manufacturing process.

While this invention has been disclosed in conjunction with specific embodiments thereof, it is evident that many alternatives, modifications and variations will be apparent to those skilled in the art in light of the foregoing description. Accordingly, it is intended to embrace all such alternatives, modifications, and variations as fall within the spirit and broad scope of the appended claims.

What is claimed is:

1. A liquid crystal display device, comprising:
   a plurality of data signal lines;
   a plurality of scanning signal lines;
   a picture element array wherein each picture element for displaying an image is formed so as to be surrounded by adjacent data signal lines and adjacent scanning signal lines;
   a plurality of first transistors as switching elements, each first transistor having a gating insulating layer and driving a corresponding picture element;
   a driving circuit for driving each picture element through each signal line and first transistor, said driving circuit including a plurality of input-output terminals;
   a common wiring composed of an electrically conductive member, formed in a vicinity of said input-output terminals of said driving circuit; and
   a first plurality of protective circuits, each protective circuit of said first plurality being connected across a corresponding input-output terminal of said driving circuit and said common wiring, each protective circuit of said first plurality including a second transistor having a semiconductor layer, wherein a threshold voltage of said second transistor is greater than a threshold voltage of said first transistor due to an insulating layer, different from the gating insulating layer of each first transistor, and formed between a gate electrode and the semiconductor layer of the second transistor and each protective circuit allows said corresponding input-output terminals to conduct where a potential difference of at least a predetermined amount is generated across said corresponding input-output terminal.

2. The liquid crystal display device as set forth in claim 1, wherein said plurality of data signal lines, said plurality of scanning signal lines, said picture element array, said plurality of first transistors, said driving circuit, said plurality of input-output terminals, said first plurality of protective circuits and said common wiring are monolithically formed on an insulating substrate.

3. The liquid crystal display device as set forth in claim 1, wherein a gating insulating layer of said second transistor is thicker than the gating insulating layer of said first transistor.

4. The liquid crystal display device as set forth in claim 3, wherein said gating insulating layer of said second transistor includes two gating insulating layers.

5. The liquid crystal display device as set forth in claim 4, wherein said two gating insulating layers are separated by said common wiring.

6. The liquid crystal display device as set forth in claim 1, wherein said second transistor has a turn-on voltage equal in magnitude to said threshold voltage of the second transistor.

7. A liquid crystal display device, comprising:
   a plurality of data signal lines;
   a plurality of scanning signal lines;
   a picture element array wherein each picture element for displaying an image is formed so as to be surrounded by adjacent data signal lines and adjacent scanning signal lines;
   a plurality of first transistors as switching elements, each first transistor having a gate insulating layer and driving a corresponding picture element;
   a driving circuit for driving each picture element through each signal line and first transistor, said driving circuit including a plurality of input-output terminals;

a common wiring composed of an electrically conductive member, formed in a vicinity of said input-output terminals of said driving circuit; and a protective circuit being connected across said common wiring and a corresponding pair of input-output terminals of said driving circuit, wherein said protective circuit includes a transistor unit having a threshold value greater than a threshold value of said first transistor due to an insulating layer, different from the gate insulating layer of the first transistor, and formed between a gate electrode and a semiconductor layer of the transistor unit, so as to allow said corresponding pair of input/output terminals to conduct where a potential difference of at least a predetermined amount is generated across said corresponding pair of input-output terminals.

8. The liquid crystal display apparatus as set froth in claim 7, wherein said predetermined potential difference is smaller than a voltage at which each driving circuit and first transistor are adversely affected.

9. The liquid crystal display apparatus as set forth in claim 7, wherein said transistor unit includes two second transistors connected in parallel.

10. The liquid crystal display apparatus as set forth in claim 9, wherein said two second transistors are connected so as to conduct in mutually opposite directions.

11. The liquid crystal display apparatus as set forth in claim 7, wherein a threshold voltage of said transistor unit is larger than respective maximum input voltages of said driving circuit and said first transistors in their active states.

* * * * *